(12) United States Patent
Lian et al.

(10) Patent No.: US 12,235,316 B2
(45) Date of Patent: Feb. 25, 2025

(54) CHIP MOVING DEVICE

(71) Applicant: SEMIGHT INSTRUMENTS CO., LTD, Suzhou (CN)

(72) Inventors: Zhe Lian, Suzhou (CN); Jianjun Huang, Suzhou (CN); Yonghong Wu, Suzhou (CN); Shan Zhao, Suzhou (CN); Haiyang Hu, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 0 days.

(21) Appl. No.: 18/427,124

(22) Filed: Jan. 30, 2024

(65) Prior Publication Data
US 2024/0310435 A1    Sep. 19, 2024

Related U.S. Application Data

(63) Continuation of application No. PCT/CN2023/134138, filed on Nov. 24, 2023.

(30) Foreign Application Priority Data

Mar. 1, 2023   (CN) .......................... 202310187136.7

(51) Int. Cl.
    *G01R 31/28*    (2006.01)
(52) U.S. Cl.
    CPC .............................. *G01R 31/2893* (2013.01)
(58) Field of Classification Search
    CPC ...... G01R 31/28; G01R 31/2893; Y02P 70/50
    USPC .................................................... 324/756.01
    See application file for complete search history.

(56) References Cited

FOREIGN PATENT DOCUMENTS

| CN | 108848666 | A |   | 11/2018 |           |
|----|-----------|---|---|---------|-----------|
| CN | 210557933 | U |   | 5/2020  |           |
| CN | 111785665 | A |   | 10/2020 |           |
| CN | 113692137 | A | * | 11/2021 | B65G 47/914 |
| CN | 215732671 | U |   | 2/2022  |           |
| CN | 115995419 | A |   | 4/2023  |           |
| CN | 116344432 | A |   | 6/2023  |           |
| JP | 2006147725 | A |   | 6/2006 |           |

OTHER PUBLICATIONS

English translation of CN 113692137 A (Year: 2021).*

* cited by examiner

*Primary Examiner* — Alesa Allgood
*Assistant Examiner* — Courtney G McDonnough
(74) *Attorney, Agent, or Firm* — ANOVA LAW GROUP, PLLC

(57) ABSTRACT

Chip moving device is provided. The chip moving device includes a base, including a mounting portion that includes an end surface and an assembly cavity extending in a horizontal direction and penetrating through the end surface, the end surface being arranged with a limiting component; an adsorption part, extending in a vertical direction and confined by the limiting component; and a clamping component, arranged in the assembly cavity and including an end extending out of the end surface of the mounting portion, the clamping component being configured to be telescopic in the horizontal direction, and provide the adsorption part with a clamping force in the horizontal direction when the clamping component is extended or contracted.

19 Claims, 10 Drawing Sheets

CHIP MOVING DEVICE

CROSS-REFERENCE TO RELATED APPLICATION

This application is a continuation application of PCT Patent Application No. PCT/CN2023/134138, filed on Nov. 24, 2023, which claims priority to Chinese patent application No. 202310187136.7, filed on Mar. 1, 2023, the entire contents of which are hereby incorporated by reference.

FIELD OF THE DISCLOSURE

The present disclosure generally relates to the field of chip testing technology and, more particularly, relates to a chip moving device.

BACKGROUND

During a chip production process in the semiconductor industry, chip testing and patching are indispensable key processes. During processes of chip testing and patching, a chip needs to be transported and high-precision patched using a patching machine and a testing machine. As a component that directly contacts the chip in the testing machine and patching machine, a patch adsorption structure plays an important role in a chip testing.

The patch adsorption structure of the chip testing machine applies magnet adsorption. During a large-scale movement of an adsorption part along a Z-axis, a magnet remains stationary. When the adsorption part moves along the Z-axis with a large stroke, a direction of a magnet's adsorption force forms an angle with the horizontal direction. Therefore, a component of the adsorption force will act on a vertical direction of the adsorption part, which will lead to an increased pick-and-place pressure of a suction nozzle of the adsorption part, thereby creating a risk of crushing a chip surface and causing damage to the chip.

BRIEF SUMMARY OF THE DISCLOSURE

One aspect of the present disclosure provides a chip moving device. The chip moving device includes a base, including a mounting portion that includes an end surface and an assembly cavity extending in a horizontal direction and penetrating through the end surface, the end surface being arranged with a limiting component; an adsorption part, extending in a vertical direction and confined by the limiting component; and a clamping component, arranged in the assembly cavity and including an end extending out of the end surface of the mounting portion, the clamping component being configured to be telescopic in the horizontal direction, and provide the adsorption part with a clamping force in the horizontal direction when the clamping component is extended or contracted.

Other aspects of the present disclosure can be understood by a person skilled in the art in light of the description, the claims, and the drawings of the present disclosure.

BRIEF DESCRIPTION OF THE DRAWINGS

Specific embodiments of the present disclosure will be described in detail below by way of illustration and not limitation with reference to accompanying drawings. Same reference numbers in the accompanying drawings identify same or similar parts or portions. A person skilled in the art should understand that the accompanying drawings are not necessarily drawn to scale.

Figure 1:
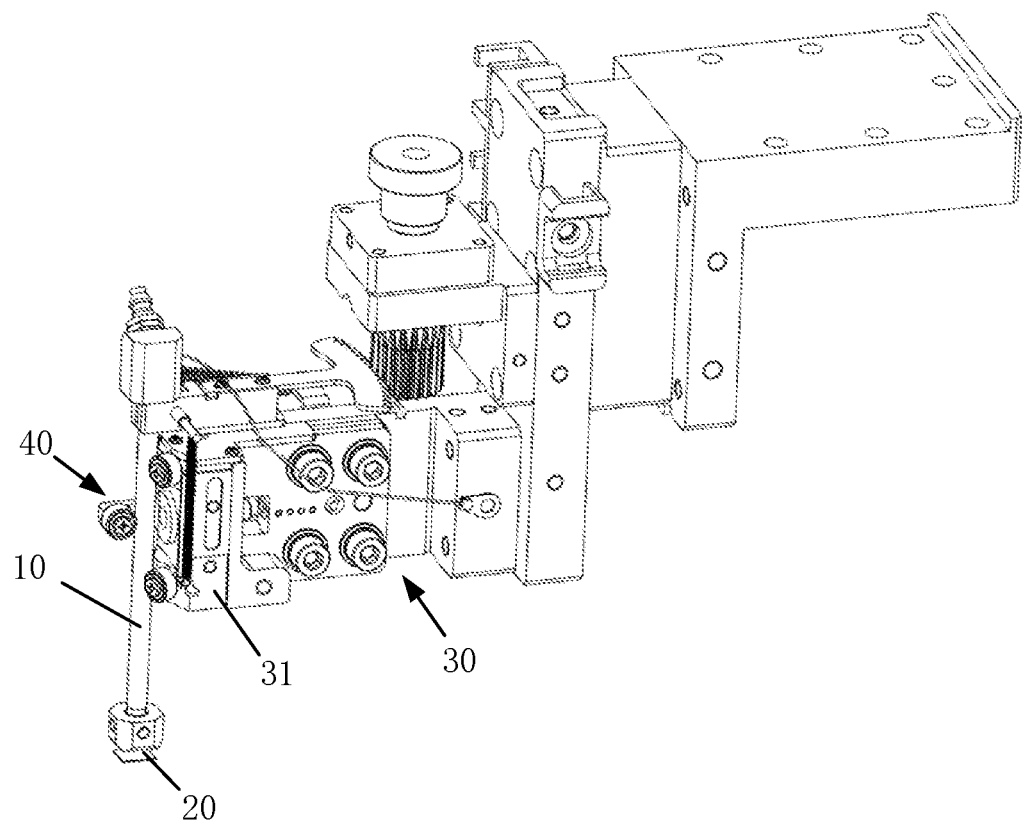
FIG. 1 illustrates a schematic diagram of a chip moving device according to various embodiments of the present disclosure.

Reference numeral list: 100—chip moving device, 10—adsorption part, 20—test chip, 30—base, 40—clamping component, 31—mounting portion, 32—limiting component, 33—end surface, 34—assembly cavity, 35—second mounting cavity, 36—second mounting part, 41—clamping portion, 42—extension portion, 43—sliding portion, 44—rotating shaft, 45—elastic part, 46—first mounting cavity, 47—first mounting part, 421—first section, 422—second section.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Exemplary Embodiment 1

Figure 2:
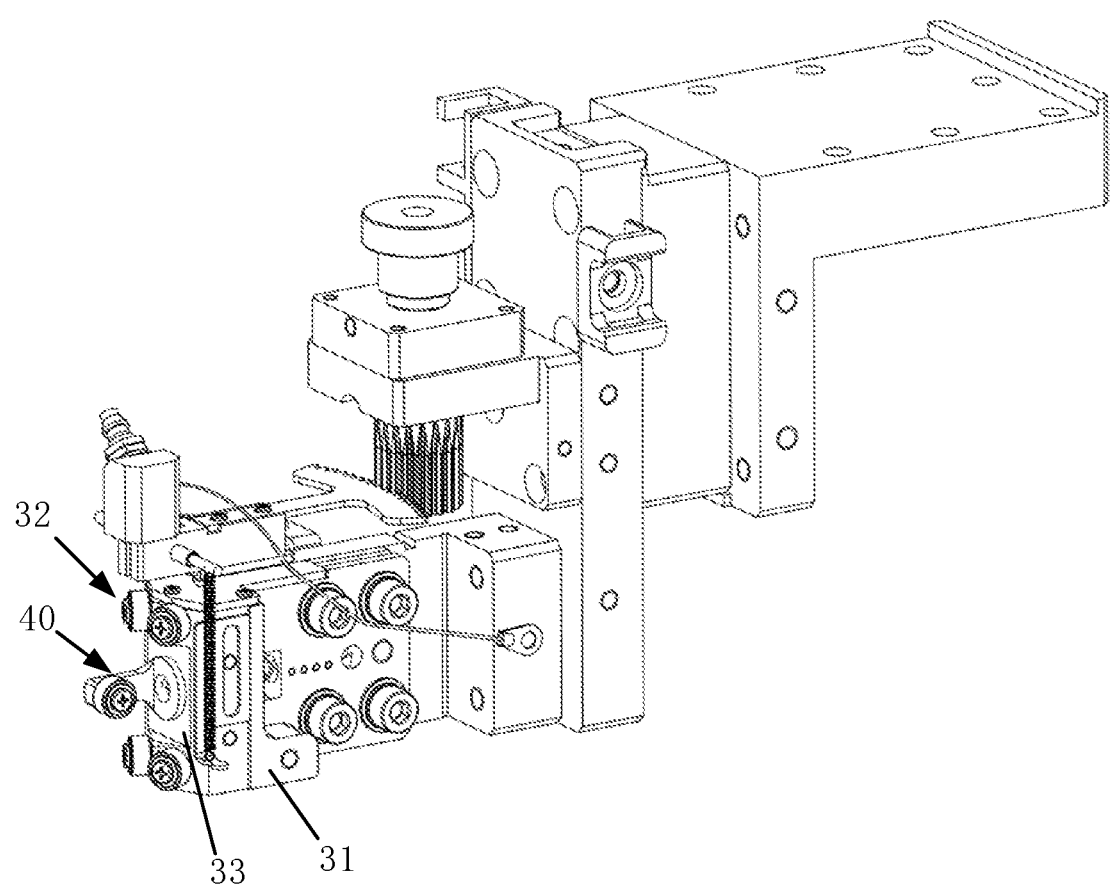
FIG. 2 illustrates an installation diagram of a base and a clamping component in the chip moving device shown in FIG. 1.
Figure 3:
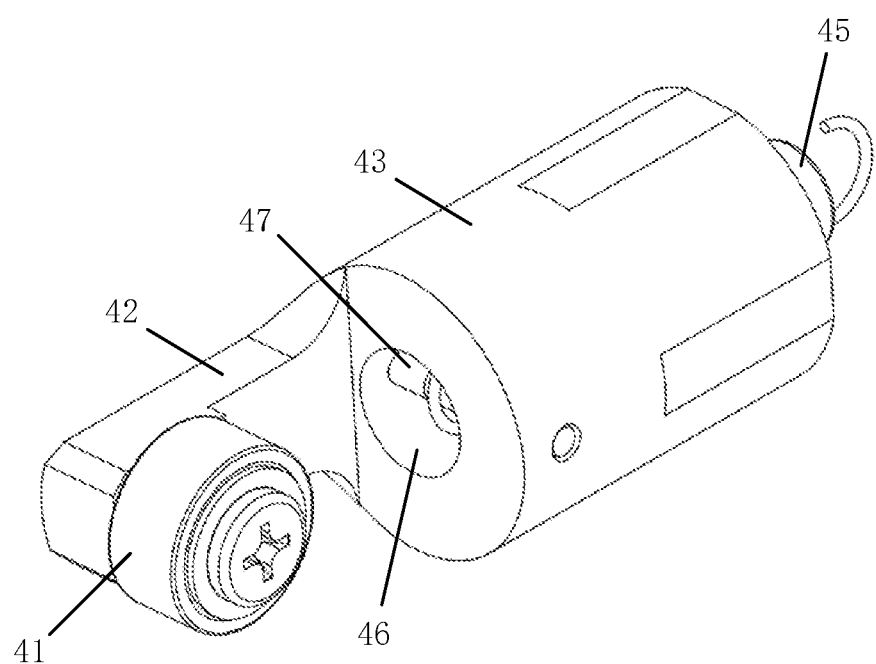
FIG. 3 illustrates a schematic diagram of the clamping component in the chip moving device shown in FIG. 1.

FIG. 1 illustrates a schematic diagram of a chip moving device provided by exemplary Embodiment 1. FIG. 2 illustrates an installation diagram of a base and a clamping component in the chip moving device shown in FIG. 1. FIG. 3 illustrates a schematic diagram of the clamping component in the chip moving device shown in FIG. 1. As shown in FIGS. 1-3, in the present embodiment, the chip moving device 100 includes a base 30, an adsorption part 10 and a clamping component 40. The base 30 includes a mounting portion 31. The mounting portion 31 includes an end surface 33 and an assembly cavity 34 extending in a horizontal direction and penetrating through the end surface 33. The end surface 33 is arranged with a limiting component 32. The adsorption part 10 extends in a vertical direction and is confined by the limiting component 32. The clamping component 40 is arranged in the assembly cavity 34 and includes one end protruding from the end surface 33 of the mounting portion 31. The clamping component 40 is configured to be telescopic in the horizontal direction and can provide a clamping force in the horizontal direction to the adsorption part 10 when the clamping component is extended or contracted. The test chip 20 is at a bottom of the adsorption part 10.

In the present embodiment, by arranging the clamping component 40, on the one hand, the clamping component 40 can provide the adsorption part 10 with a clamping force in the horizontal direction to clamp the adsorption part 10 without generating a component force in the vertical direction, thereby preventing a damage to the test chip 20; on the other hand, the clamping component 40 can be telescopically extended to connect to or separate from the adsorption part 10, offering flexibility and convenience for replacing the adsorption part 10.

In the present embodiment, the clamping component 40 includes a clamping portion 41 on a side of the adsorption part 10 away from the end surface 33 of the mounting portion 31. That is, the clamping portion 41 is arranged on a front side of the adsorption part 10, and the adsorption part 10 is located between the clamping portion 41 and the mounting portion 31 of the clamping component 40.

Figure 4:
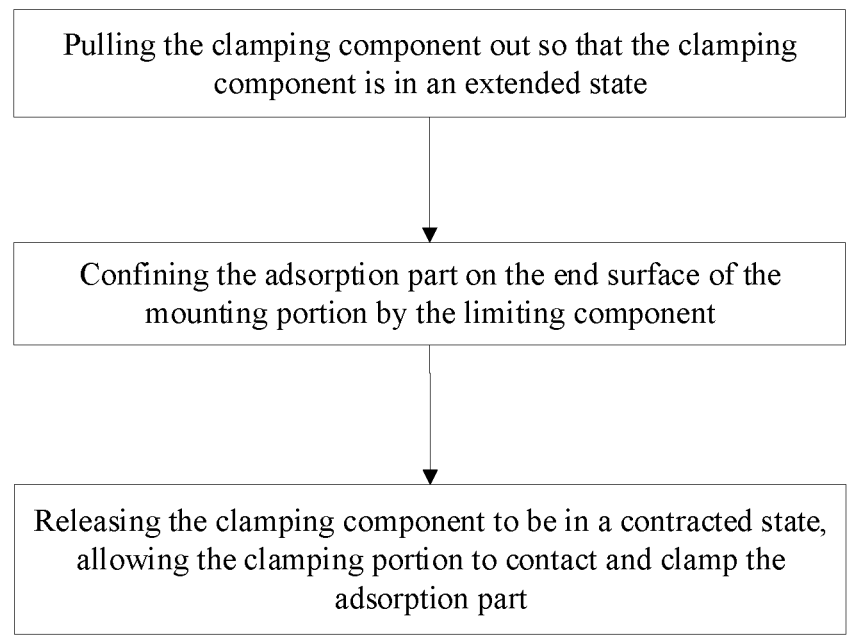
FIG. 4 illustrates a flow chart of clamping an adsorption part in the chip moving device shown in FIG. 1.

In the present embodiment, the clamping portion 41 is a bearing. An outer peripheral surface of the bearing contacts and clamps the adsorption part 10. FIG. 4 illustrates a flow chart of clamping an adsorption part in the chip moving device shown in FIG. 1. When the adsorption part 10 is clamped, the clamping component 40 is pulled out so that the clamping component 40 is in an extended state, the limiting component 32 is used to confine the adsorption part 10 on the end surface 33 of the mounting portion 31, and the clamping component 40 is released to be in a contracted state, allowing the clamping portion 41 to contact and clamp the adsorption part 10. In the present embodiment, when the adsorption part 10 moves in the vertical direction, the bearing can roll, enabling clamping the adsorption part 10 without affecting upward and downward movements of the adsorption part 10. In other embodiments, the clamping portion 41 can also be configured as claws, which are open when the clamping component 40 is extended and are closed to clamp the adsorption part 10 when the clamping component 40 is contracted.

Figure 5:
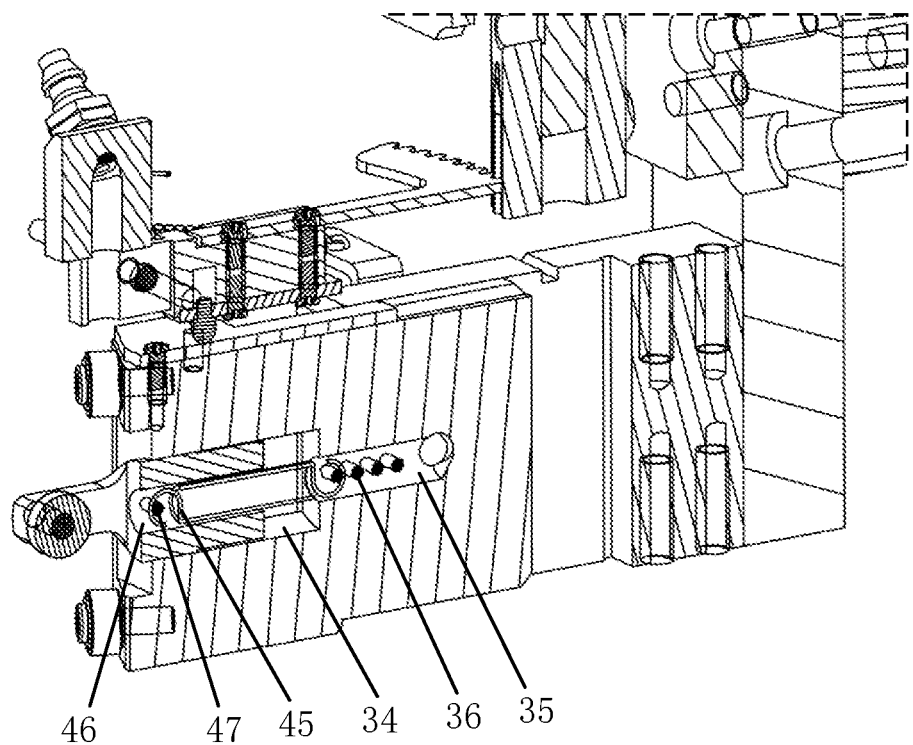
FIG. 5 illustrates a cross-sectional view of the chip moving device according to various embodiments of the present disclosure.

FIG. 5 illustrates a cross-sectional view of the chip moving device provided by the exemplary Embodiment 1. As shown in FIG. 5, and referring to FIGS. 1-3, in the present embodiment, the clamping component 40 also includes a sliding portion 43 and an elastic part 45. The sliding portion 43 is arranged in the assembly cavity 34 and can slide along the assembly cavity 34. The extension portion 42 is formed by extending outward from a side of the sliding portion 43 close to the end surface 33 of the mounting portion 31. The elastic part 45 is arranged on a side of the sliding portion 43 away from the end surface 33 of the mounting portion 31. One end of the elastic part 45 is connected to the sliding portion 43, and the other end of the elastic part 45 is connected to the mounting portion 31 to allow the clamping component 40 to expand and contract along the horizontal direction.

In the present embodiment, the clamping component 40 also includes an extension portion 42 extending out of the end surface 33 of the mounting portion 31. The extension portion 42, the clamping portion 41 and the sliding portion 43 jointly form a groove to confine the adsorption part 10 in the groove and allow the adsorption part 10 to disengage from the extension portion 42 at an opening of the groove.

In the present embodiment, when the adsorption part 10 needs to be replaced, only pulling the clamping component 40 is needed to separate the clamping portion 41 from the adsorption part 10. The adsorption part 10 can be removed from the base 30 by taking the adsorption part 10 out from the opening of the groove, that is, taking the adsorption part 10 out from a side of the clamping component 40, which is relatively convenient and allows the adsorption part 10 to be quickly replaced.

In the present embodiment, the sliding portion 43 has an interior with a first mounting cavity 46 extending along the horizontal direction. A first mounting part 47 is arranged in the first mounting cavity 46. The mounting portion 31 has an interior with a second mounting cavity 35 extending along the horizontal direction and connected to the assembly cavity 34. The second mounting cavity 35 is arranged with at least one second mounting part 36. Two ends of the elastic part 45 are connected to the first mounting part 47 and one of the at least one second mounting part 36 respectively. The elastic part 45 is a spring. The first mounting part 47 is rod-shaped and extends in a direction perpendicular to the horizontal direction. Two ends of the first mounting part 47 are connected to the sliding portion 43, and one end of the spring is hooked at the first mounting part 47. In the present embodiment, number of the second mounting parts 36 is plural. The plurality of second mounting parts 36 is spaced apart in the horizontal direction. A second mounting part 36 is also rod-shaped, and an extending direction of the mounting part 36 is consistent with an extending direction of the first mounting part 47. The spring is hooked on one of the plurality of second mounting parts 36. In the present embodiment, by arranging the plurality of second mounting parts 36, the elastic part 45 can be hooked at one of the plurality of second mounting parts 36 according to specific design requirements, particularly considering a required displacement amount of the clamping component 40 and an elastic performance of the elastic part 45.

In the present embodiment, the limiting component 32 includes at least one pair of limiting portions. Each pair of limiting portions includes two oppositely arranged bearings. The two bearings of each pair of limiting portions jointly confine the adsorption part 10, thereby limiting the adsorption part 10 to the end surface 33 of the mounting portion 31. In the present embodiment, the limiting component 32 includes two pairs of limiting portions spaced apart in the vertical direction. The clamping component 40 is located between the two pairs of limiting portions. It can be understood that one pair of the two pairs of limiting portions is arranged near a top of the end surface 33 of the mounting portion 31, and the other pair of limiting portions is arranged near a bottom of the end surface 33 of the mounting portion 31. In the present embodiment, upper, middle, and lower positions of the adsorption part 10 are all clamped, enhancing an assembly stability of the adsorption part 10.

In the present embodiment, a method of using magnets to absorb the adsorption part 10 is eliminated. The adsorption part 10 is clamped in a telescopic and stretching manner with better stability, which ensures that a pressure of the adsorption part 10 in the vertical direction is unaffected by a tensile force in the horizontal direction. Therefore, the adsorption part 10 can maintain a stable pick-and-place pressure for a long time, thereby preventing damages to the test chip 20.

Exemplary Embodiment 2

Figure 6:
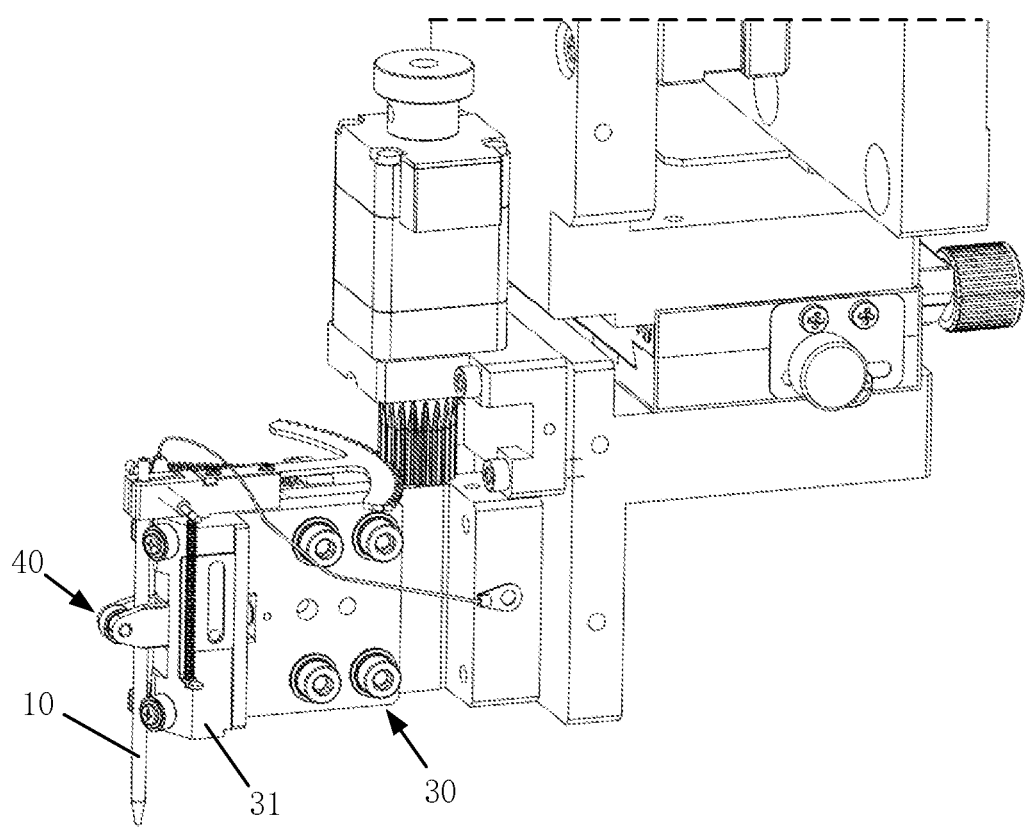
FIG. 6 illustrates another cross-sectional view of a chip moving device according to various embodiments of the present disclosure.

FIG. 6 illustrates another cross-sectional view of a chip moving device provided by exemplary Embodiment 2. FIG.

Figure 7:
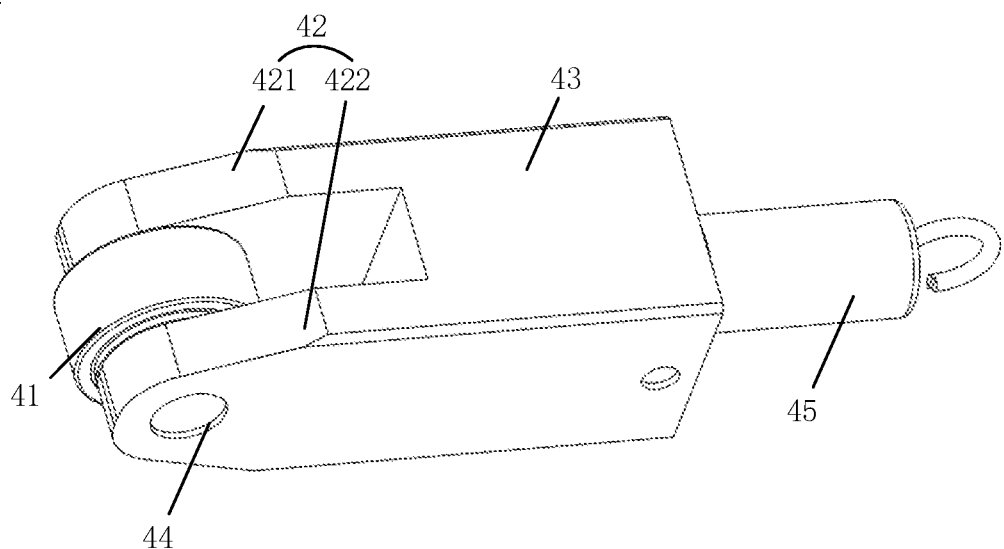
FIG. 7 illustrates a schematic diagram of the clamping component in the chip moving device shown in FIG. 6.
Figure 8:
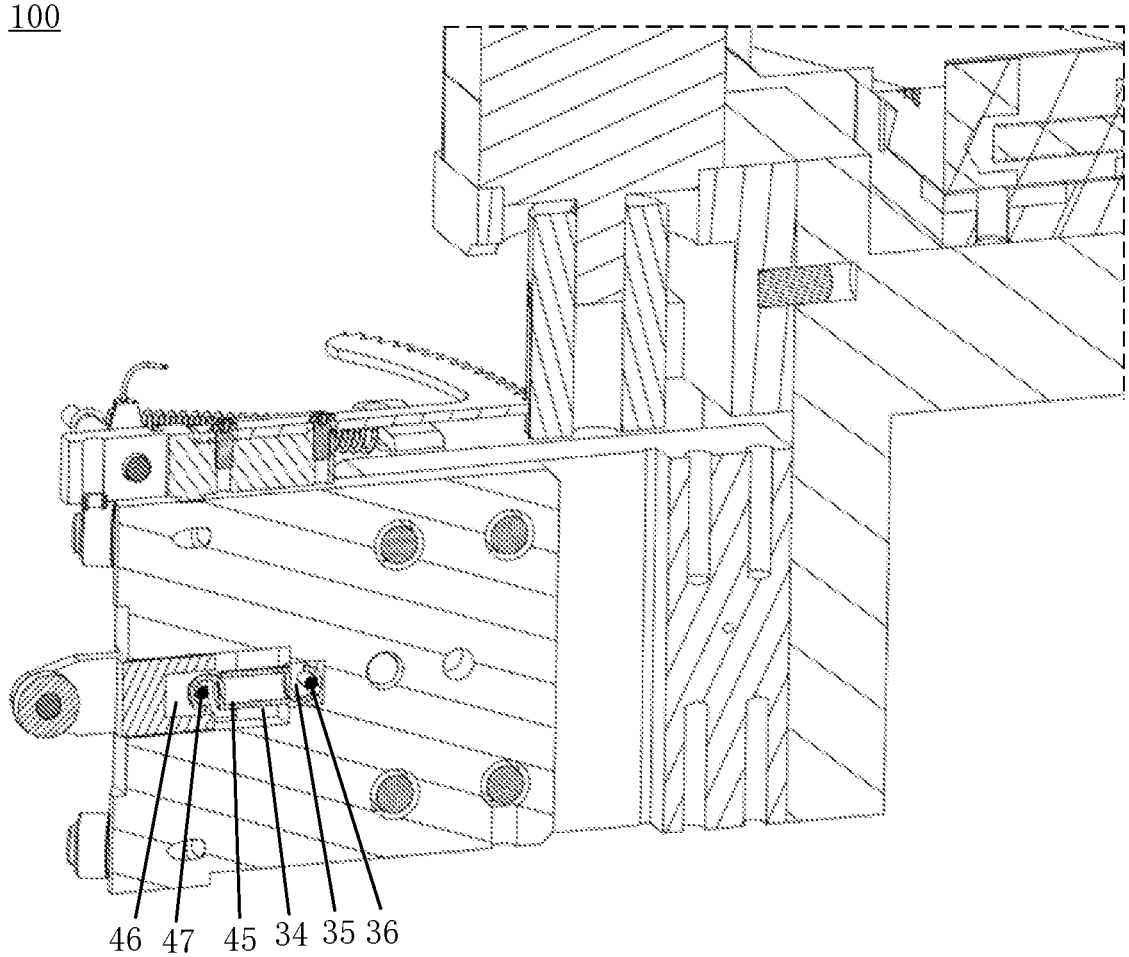
FIG. 8 illustrates another cross-sectional view of a chip moving device according to various embodiments of the present disclosure.
Figure 9:
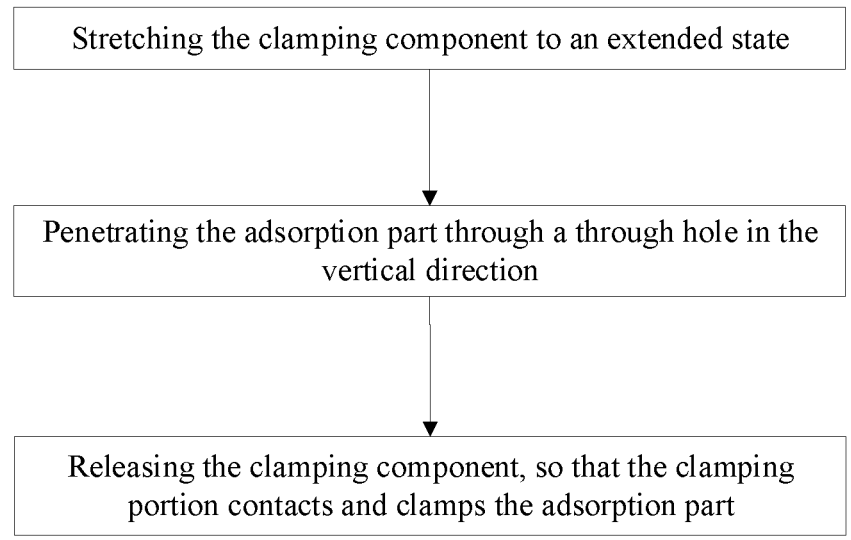
FIG. 9 illustrates another flow chart of clamping an adsorption part in the chip moving device shown in FIG. 6.

7 illustrates a schematic diagram of the clamping component in the chip moving device shown in FIG. 6. FIG. 8 illustrates another cross-sectional view of a chip moving device provided by exemplary Embodiment 2. As shown in FIGS. 6-8, a difference between the present embodiment and exemplary Embodiment 1 is that the clamping component 40 also includes an extension portion 42 extending out of the end surface 33 of the mounting portion 31. The extension portion 42, the clamping portion 41 and the sliding portion 43 jointly form a through hole, and the adsorption part 10 penetrates through the through hole. FIG. 9 illustrates another flow chart of clamping an adsorption part in the chip moving device shown in FIG. 6. Specifically, when the adsorption part 10 is clamped, the clamping component 40 is stretched to an extended state, the adsorption part 10 is penetrated through the through hole in the vertical direction, and the clamping component 40 is released, so that the clamping portion 41 contacts and clamps the adsorption part 10.

In the present embodiment, as shown in FIG. 6, the extension portion 42 includes a first section 421 and a second section 422, both extending in the horizontal direction and arranged oppositely. The first section 421 and the second section 422 are connected through a rotating shaft 44, and the clamping member is arranged at the rotating shaft 44. Both the first section 421 and the second section 422 are formed by extending outward from a side of the sliding member close to the end surface 33 of the mounting portion 31.

Exemplary Embodiment 3

A difference between the present embodiment and the exemplary Embodiment 1 is that the clamping component 40 includes a clamping portion 41 on a side of the adsorption part 10 close to the end surface 33 of the mounting portion 31. That is, the adsorption part 10 is at an outermost side, and the clamping portion 41 is located between the adsorption part 10 and the end surface 33 of the mounting portion 31.

Figure 10:
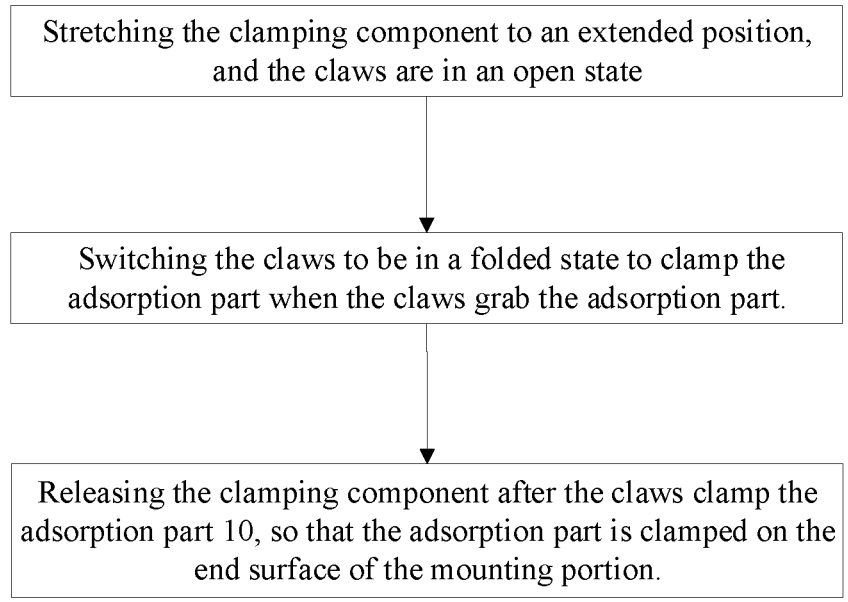
FIG. 10 illustrates another flow chart of clamping an adsorption part in a chip moving device.

In the present embodiment, the clamping portion 41 consists of claws configured to contact and clamp the adsorption part 10. FIG. 10 illustrates another flow chart of clamping an adsorption part in a chip moving device. Specifically, when the adsorption part 10 is clamped, the clamping component 40 is first stretched to an extended position, and the claws are in an open state. When the claws grab the adsorption part 10, the claws are switched to be in a folded state to clamp the adsorption part 10. After the claws clamp the adsorption part 10, the clamping component 40 is released, so that the adsorption part 10 is clamped on the end surface 33 of the mounting portion 31. The claws can be made of engineering plastics with low friction coefficient such as Teflon or polyoxymethylene (POM) to avoid damage to the adsorption part 10.

As disclosed, the chip moving device provided by the present disclosure at least realizes the following beneficial effects.

In the present disclosure, the chip moving device includes a base, an adsorption part, and a clamping component. The base includes a mounting portion. The mounting portion includes an end surface and an assembly cavity extending in a horizontal direction and penetrating through the end surface, and a limiting component is arranged on the end surface. The adsorption part extends in a vertical direction and is confined by the limiting component. The clamping component is arranged in an assembly cavity and includes an end protruding from the end surface of the mounting portion. The clamping component is configured to be telescopic in the horizontal direction and can provide a horizontal clamping force to the adsorption part when the clamping component is extended or contracted. By arranging the clamping component, the above technical solution can, on the one hand, provide a horizontal clamping force for the adsorption part to clamp the adsorption part without generating a component force in the vertical direction, thereby preventing a damage to the test chip. On the other hand, the clamping component can be telescopically extended to connect to or separate from the adsorption, offering flexibility and convenience for replacing the adsorption part. Furthermore, in the present disclosure, the clamping portion is a bearing, and an outer peripheral surface of the bearing contacts and clamps the adsorption part. In the above technical solution, when the adsorption part moves in the vertical direction, the bearing rotates, ensuring that a movement of the adsorption part is unaffected when the adsorption part is clamped.

A person skilled in the art should understand that, although exemplary embodiments of the present disclosure have been detailed herein, without departing from the spirit and scope of the present disclosure, numerous other variations, or modifications consistent with principles of the disclosure are directly determined or deduced from the content of the present disclosure. Therefore, the scope of the present disclosure should be understood and deemed to cover all such variations or modifications.

What is claimed is:

1. A chip moving device, comprising:
   a base, including a mounting portion that includes an end surface and an assembly cavity extending in a horizontal direction and penetrating through the end surface, the end surface being arranged with a limiting component;
   an adsorption part, extending in a vertical direction and confined by the limiting component; and
   a clamping component, arranged in the assembly cavity and including an end extending out of the end surface of the mounting portion, the clamping component being configured to be telescopic in the horizontal direction, and provide the adsorption part with a clamping force in the horizontal direction when the clamping component is extended or contracted.

2. The chip moving device according to claim 1, wherein the clamping component includes a clamping portion on a side of the end surface of the adsorption part away from the mounting portion.

3. The chip moving device according to claim 1, wherein the clamping component includes a clamping portion on a side of the adsorption part close to the end surface of the mounting portion.

4. The chip moving device according to claim 2, wherein the clamping portion comprises claws configured to engage with the adoption part and secure the adsorption part in place by clamping.

5. The chip moving device according to claim 3, wherein the clamping portion comprises claws configured to engage with the adoption part and secure the adsorption part in place by clamping.

6. The chip moving device according to claim 2, wherein the clamping portion is a bearing, and an outer peripheral surface of the bearing abuts and clamps the adsorption part.

7. The chip moving device according to claim 6, wherein the clamping component includes:
   a sliding portion, arranged in the assembly cavity and can slide along the assembly cavity; and an elastic part, one end of the elastic part being connected to the sliding portion and the other end of the elastic part being connected to the mounting portion to allow the clamping component to expand and contract along the horizontal direction.

8. The chip moving device according to claim 7, wherein the clamping component further includes an extension portion extending out of the end surface of the mounting portion, the extension portion, the clamping portion, and the sliding portion jointly form a through hole, and the adsorption part penetrates through the through hole.

9. The chip moving device according to claim 8, wherein the extension portion includes a first section and a second section, both extending along the horizontal direction and arranged oppositely, the first section and the second section are connected through a rotating shaft, and the clamping portion is arranged on the rotating shaft.

10. The chip moving device according to claim 7, wherein the clamping component further includes an extension portion extending out of the end surface of the mounting portion, the extension portion, the clamping portion, and the sliding portion jointly form a groove to confine the adsorption part within the groove and allow the adsorption part to disengage from the extension portion at an opening of the groove.

11. The chip moving device according to claim 1, wherein the limiting component includes at least one pair of limiting portions, each pair of limiting portions includes two oppositely arranged bearings, and the two bearings of each pair of limiting portions jointly confine the adsorption part.

12. The chip moving device according to claim 7, wherein:
the sliding portion has an interior with a first mounting cavity extending in the horizontal direction inside, and a first mounting part is arranged in the first mounting cavity; and
the mounting portion has an interior arranged with a second mounting cavity extending along the horizontal direction and connected to the assembly cavity, at least one second mounting part is arranged in the second mounting cavity, and two ends of the elastic part are connected to the first mounting part and one of the at least one second mounting part respectively.

13. The chip moving device according to claim 12, wherein:
the elastic part is a spring, the first mounting part is rod-shaped and extends in a direction perpendicular to the horizontal direction, two ends of the first mounting part are connected to the sliding portion, and one end of the spring is hooked at the first mounting part; and
number of the second mounting parts is plural, the plurality of second mounting parts is spaced apart in the horizontal direction, a second mounting part of the plurality of second mounting parts is rod-shaped, and an extending direction of the second mounting part is consistent with an extending direction of the first mounting part, and the spring is hooked on one of the plurality of second mounting parts.

14. The chip moving device according to claim 8, wherein:
the sliding portion has an interior with a first mounting cavity extending in the horizontal direction inside, and a first mounting part is arranged in the first mounting cavity; and
the mounting portion has an interior arranged with a second mounting cavity extending along the horizontal direction and connected to the assembly cavity, at least one second mounting part is arranged in the second mounting cavity, and two ends of the elastic part are connected to the first mounting part and one of the at least one second mounting part respectively.

15. The chip moving device according to claim 14, wherein:
the elastic part is a spring, the first mounting part is rod-shaped and extends in a direction perpendicular to the horizontal direction, two ends of the first mounting part are connected to the sliding portion, and one end of the spring is hooked at the first mounting part; and
number of the second mounting parts is plural, the plurality of second mounting parts is spaced apart in the horizontal direction, a second mounting part of the plurality of second mounting parts is rod-shaped, and an extending direction of the second mounting part is consistent with an extending direction of the first mounting part, and the spring is hooked on one of the plurality of second mounting parts.

16. The chip moving device according to claim 9, wherein:
the sliding portion has an interior with a first mounting cavity extending in the horizontal direction inside, and a first mounting part is arranged in the first mounting cavity; and
the mounting portion has an interior arranged with a second mounting cavity extending along the horizontal direction and connected to the assembly cavity, at least one second mounting part is arranged in the second mounting cavity, and two ends of the elastic part are connected to the first mounting part and one of the at least one second mounting part respectively.

17. The chip moving device according to claim 16, wherein:
the elastic part is a spring, the first mounting part is rod-shaped and extends in a direction perpendicular to the horizontal direction, two ends of the first mounting part are connected to the sliding portion, and one end of the spring is hooked at the first mounting part; and
number of the second mounting parts is plural, the plurality of second mounting parts is spaced apart in the horizontal direction, a second mounting part of the plurality of second mounting parts is rod-shaped, and an extending direction of the second mounting part is consistent with an extending direction of the first mounting part, and the spring is hooked on one of the plurality of second mounting parts.

18. The chip moving device according to claim 10, wherein:
the sliding portion has an interior with a first mounting cavity extending in the horizontal direction inside, and a first mounting part is arranged in the first mounting cavity; and
the mounting portion has an interior arranged with a second mounting cavity extending along the horizontal direction and connected to the assembly cavity, at least one second mounting part is arranged in the second mounting cavity, and two ends of the elastic part are connected to the first mounting part and one of the at least one second mounting part respectively.

19. The chip moving device according to claim 18, wherein:
the elastic part is a spring, the first mounting part is rod-shaped and extends in a direction perpendicular to the horizontal direction, two ends of the first mounting part are connected to the sliding portion, and one end of the spring is hooked at the first mounting part; and number of the second mounting parts is plural, the plurality of second mounting parts is spaced apart in the horizontal direction, a second mounting part of the plurality of second mounting parts is rod-shaped, and an extending direction of the second mounting part is consistent with an extending direction of the first mounting part, and the spring is hooked on one of the plurality of second mounting parts.

\* \* \* \* \*